US007223811B2

(12) United States Patent
Nagy et al.

(10) Patent No.: US 7,223,811 B2
(45) Date of Patent: May 29, 2007

(54) NANOCOMPOSITE: PRODUCTS, PROCESS FOR OBTAINING THEM AND USES THEREOF

(75) Inventors: Janos B. Nagy, Jambes (BE); Christophe Pirlot, Petite-Chapelle (BE); Antonio Fonseca, Louvain-la-Neuve (BE); Gregory Philippin, Noirefontaine (BE); Joseph Delhalle, Noville-les-Bois (BE); Zineb Mekhalif, Namur (BE); Robert Sporken, Erpent (BE); Philippe Dubois, Ciplet (BE); Michaël Alexandre, Ougree (BE); Günter Beyer, Eupen (BE)

(73) Assignee: Facultes Universitaires Notre-Dame de la Paix, Namur (BE)

( * ) Notice: Subject to any disclaimer, the term of this patent is extended or adjusted under 35 U.S.C. 154(b) by 0 days.

(21) Appl. No.: 10/508,273

(22) PCT Filed: Mar. 20, 2003

(86) PCT No.: PCT/BE03/00049

§ 371 (c)(1),
(2), (4) Date: Feb. 17, 2005

(87) PCT Pub. No.: WO03/078315

PCT Pub. Date: Sep. 25, 2003

(65) Prior Publication Data

US 2005/0154116 A1 Jul. 14, 2005

(30) Foreign Application Priority Data

Mar. 20, 2002 (EP) .................................. 02447039
Sep. 4, 2002 (EP) .................................. 02447166

(51) Int. Cl.
  *C08K 3/04* (2006.01)
  *C08K 3/34* (2006.01)
(52) U.S. Cl. ...................... 524/442; 524/445; 524/492; 524/495; 257/E51.04

(58) Field of Classification Search ................ 524/445, 524/492, 495, 442; 257/E51.04
See application file for complete search history.

(56) References Cited

U.S. PATENT DOCUMENTS

| 6,124,365 A | 9/2000 | Lan et al. |
| 6,126,734 A | 10/2000 | Beall et al. |
| 6,395,386 B2 | 5/2002 | Bagrodia et al. |
| 6,407,155 B1 | 6/2002 | Quin et al. |
| 6,414,070 B1 | 7/2002 | Kausch et al. |
| 6,423,768 B1 | 7/2002 | Khouri |

FOREIGN PATENT DOCUMENTS

| EP | 0 949 199 | 10/1999 |
| EP | 1 186 572 | 3/2002 |
| WO | WO 02/076903 A2 | 10/2002 |
| WO | WO 02/076903 A3 | 10/2002 |

OTHER PUBLICATIONS

Database WPI, Section Ch, Week 199730 Derwent Publications Litd., London, GB; Class A85, AN 1997-328559, XP002252198 & JP 09 132695 A Agency of Ind. Sci & Technology May 1997, abstract.
Thostenson E.T. et al. Oct. 2001 "Advances in the science and technology of carbon nanotubes and their composites: a review," *Composites Science and Technology* 61(13): 1899-1912.
Wu S-H et al. Jul. 2001 "Mechanical, thermal and morphological properties of glass fiber and carbon fiber reinforced polyamide-6 and polyamide-6/clay nanocomposites," *Materials Letters* 49(6):327-333.
Alexandre, M. et al. Mar. 2000 "Polymer-layered silicate nanocomposites: preparation, properties and uses of a new class of materials" *Materials Science and Engineering* 28:1-63.

*Primary Examiner*—Kriellion Sanders
(74) *Attorney, Agent, or Firm*—Knobbe, Martens, Olson & Bear LLP

(57) ABSTRACT

The present invention is related to nanocomposites comprising polymers, carbon nanotubes and layered silicate nanoparticles. The present invention also concerns methods for obtaining said nanocomposites as well as their uses.

6 Claims, 1 Drawing Sheet

NANOCOMPOSITE: PRODUCTS, PROCESS FOR OBTAINING THEM AND USES THEREOF

RELATED APPLICATIONS

Figure 1:
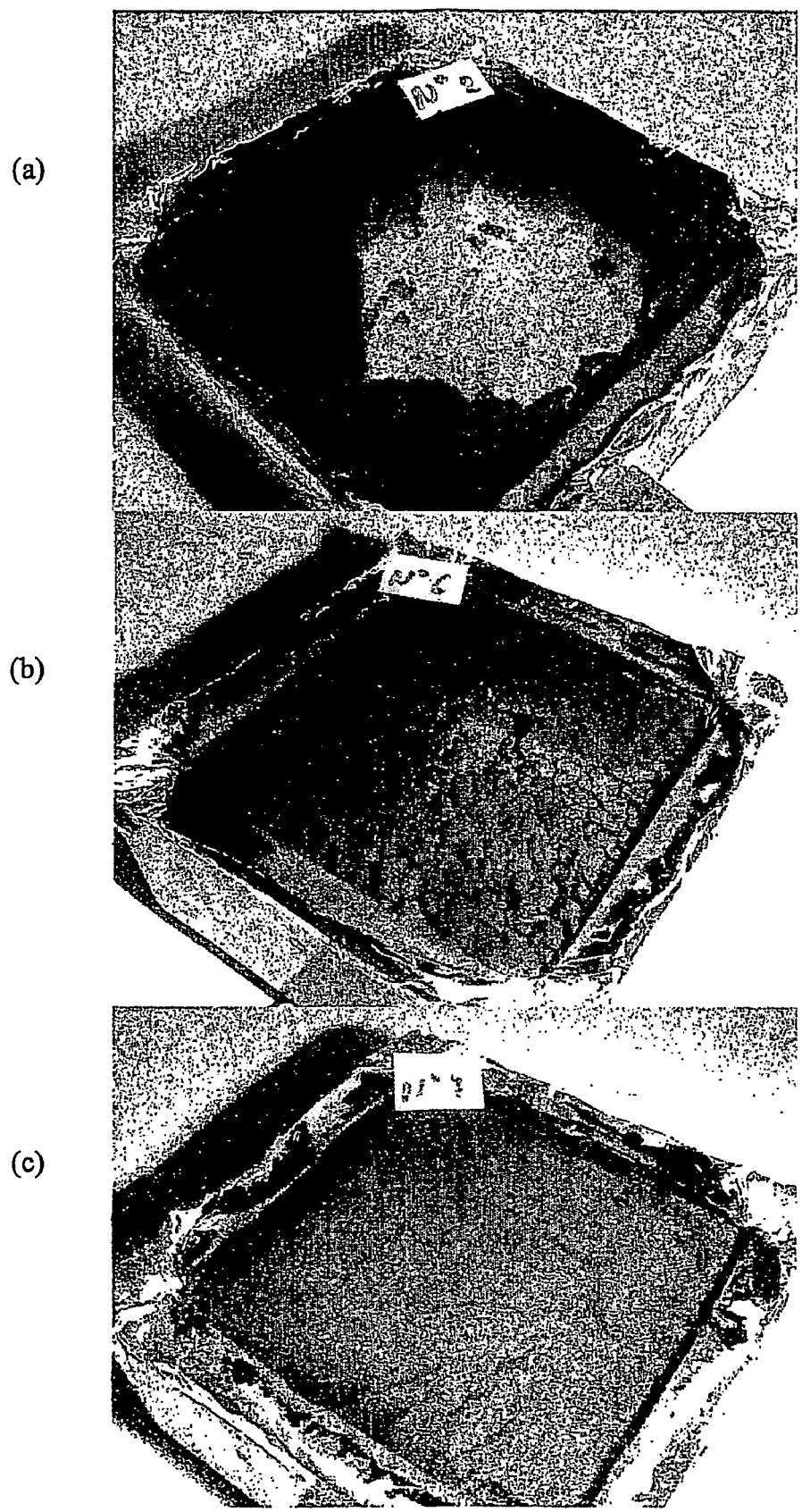

This Application is a U.S. National Phase of an International Patent Application PCT/BE03/00049 filed Mar. 20, 2003 designating the US and published in English as WO 03/078315 on Sep. 25, 2003, which claims the benefit of a European Patent Application No. 02447039.5 filed Mar. 20, 2002 and a European Patent Application No. 02447166.6 filed Sep. 4, 2002, both of which are incorporated herein by reference in their entireties.

FIELD OF THE INVENTION

The present invention is related to the field of composite materials comprising polymers and carbon nanotubes.

STATE OF THE ART

Carbon nanotubes were first observed by Iijima in 1991 (S. Iijima, Nature 354 (1991) 56–58). The tubes are built up of carbon atoms arranged in hexagons and pentagons, with the pentagons concentrated in areas such as the tube ends. Typically, the carbon nanotubes consist of single-wall tubes (hereafter SWNTs) and multi-wall tubes (hereafter MWNTs).

Carbon nanotubes are flexible and resistant to the applied stress. They have potential industrial applications in various fields such as in field emission devices, electrical and thermal conductivity, hydrogen storage and molecular sieves.

Carbon nanotubes can be produced for example, by arc discharge, by laser ablation or by catalytic decomposition of hydrocarbons.

The production of some polymer based composite materials comprising carbon nanotubes is described in the literature (C. Pirlot et al., Adv. Eng. Mater. 4, N° 3 (2002) 109–114; B. McCarthy et al., J. Phys. Chem. B 106 (2002) 2210–2216; V. K. Gupta et al., World Patent Information 22 (2000) 185–189). Nevertheless, industrials find major difficulties to get the homogeneous dispersion of the nanotubes in the polymer matrices, resulting in the transfer of only parts of the interesting properties from the carbon nanotubes to the composite materials.

AIMS OF THE INVENTION

The present invention aims to provide nanocomposites comprising polymers and carbon nanotubes which would not present the drawbacks of the nanocomposites of the state of the art.

More precisely, the present invention aims to provide nanocomposites with enhanced physical properties, namely enhanced mechanical and electrical properties, comparatively to the composites of the state of the art, which could be industrially interesting.

Another object of the present invention is to provide nanocomposites which could be produced industrially with relative ease and relative moderate cost.

SUMMARY OF THE INVENTION

The present invention is related to nanocomposite, comprising as components polymers, carbon nanotubes and layered silicate nanoparticles.

Preferably, said nanocomposite components are homogeneously dispersed.

Preferably, polymers are selected from the group consisting of thermoplastic polymers, polyolefins, vinylic polymers, acryl-nitrile polymers, polyacrylates, elastomers, fluoro-polymers, thermoplastic polycondensates, duroplastic polycondensates, silicon resins, thermoplastic elastomers, co- and ter-polymers, grafted polymers and mixtures thereof.

Preferably, the carbon nanotubes are selected from the group consisting of SWNTs, and MWNTs, said carbon nanotubes being pure, partly purified, crude or functionalized.

Preferably, the layered silicate nanoparticles are organo-modified layered silicate nanoparticles.

Preferably, the layered silicate nanoparticles are intercalated organo-modified layered silicates from the chemical class of 2:1 phyllosilicate and smectite.

Advantageously, the total content of the layered silicates and carbon nanotubes varies from 0.01 to 50 wt. %, preferably from 0.5 to 25 wt %, and most preferably between 1 and 10 wt. %.

Advantageously, the carbon nanotubes to the layered silicate nanoparticles weight ratio varies from 0.01 to 100, and preferably between 0.1 and 10.

Preferably, the nanocomposite of the present invention further comprises at least one microfiller, preferably in a quantity varying from 1 to 70 wt %.

The present invention is also related to the use of said nanocomposites.

In particular the present invention is related to different uses of the nanocomposites according to the present invention:

in anti-fire protection structures
as flame retardant
as light-emitter
as anti-static materials
as conductive wires
as wire protector sheath
as anti-cracks in surface protection coatings
as anti-cracks in reinforced materials
as surface protection coatings
as reinforced materials.

Another object of the present concerns the use of the nanocomposites of the invention as flame retardant.

The present invention is also related to a process for obtaining the nanocomposite of the invention, said process comprising the step of providing the different components i.e. the polymers, the carbon nanotubes, the layered silicate nanoparticles, and if necessary the microfiller, and the step of mixing said different components in adequate conditions so as to obtain an homogenous dispersion.

Preferably, in said process, the step of providing the carbon nanotubes comprises the step of producing said carbon nanotubes on a M/MgO catalyst, wherein M is selected from the group consisting of Co, Fe, Ni, Mo or their mixtures, and M represents 0.1–50 wt % of the catalyst, the MgO being prepared in situ from metallic magnesium.

Preferably, in said process, the step of providing the carbon nanotubes further comprises the step of purifying the crude carbon nanotubes as produced in claim 14, by oxidation of the crude nanotubes at 250–500° C. in pure or diluted oxygen for a given time, prior to the dissolution of the spent catalyst, while the nanotubes are well dispersed on it.

In one preferred embodiment of said process, the step of providing the carbon nanotubes further comprises the step of drying the carbon nanotubes produced to obtain a very fine powder, by lyophilisation of a nanotubes/water "wet cake" containing preferably 80–95 wt % of water.

In another preferred embodiment of said process, the step of providing the carbon nanotubes further comprises the step of drying the carbon nanotubes produced to obtain a very fine powder, by azeotrope distillation of a nanotubes/water "wet cake" containing preferably 80–95 wt % of water and wherein benzene, toluene or xylene is used to make the azeotrope.

DEFINITIONS

It should be noted that in the present description the wordings "nanocomposites based on . . . " and "nanocomposites comprising" are equivalent.

The terms "filler" and "microfiller" refer to any other constituent of the nanocomposite except the polymer.

It is meant by "dispersion" the dispersion of the components, namely the carbon nanotubes, in the polymer matrix.

SHORT DESCRIPTION OF THE DRAWINGS

FIGS. 1a and 1b give images of the residues, after cone calorimeter analysis at 35 kW/m², of nanocomposites comprising EVA (EVA=ethylene-vinyl acetate copolymer; Escorene UL 00328) as polymer, and 4.8 wt. % of purified MWNTs (FIG. 1a: sample 2) or organo-clay (FIG. 1b: sample 6). A cone calorimeter analysis of residues of EVA-based nanocomposites containing both 2.4 wt. % of purified MWNTs and 2.4 wt. % of organo-clay is also represented on FIG. 1c: sample 7.

DETAILED DESCRIPTION OF THE INVENTION

I. Description of the Starting Materials

I.A.—Polymers

The polymers that can be used can be selected from thermoplastic polymers (like polystyrene, etc.), polyolefins (like polyethylene, polypropylene, etc.), vinylic polymers (like PVC or PVDF), acryl-nitrile polymers, polyacrylates, elastomers, fluoro polymers, thermoplastic polycondensates (like PA, PC, PETP), duroplastic polycondensates, silicon resins, thermoplastic elastomers, co-polymers (like EVA, etc.), ter-polymers, grafted polymers and also their blends.

A summary of suitable polymers can be found at: Hans Dominghaus "Die Kunststoffe und ihre Eigenschaften" 2 Auflage, VDI-Verlag, Seite VII bis XI.

I.B.—Nanotubes

The nanotubes are SWNTs, MWNTs or their mixtures. The nanotubes are either pure, partly purified, crude or functionalized. The crude nanotubes contain the spent catalysts and the other forms of carbon that are by-products of the nanotubes synthesis. The by-products are amorphous carbon, pyrolytic carbon, carbon nanoparticles, carbon onions, fullerenes, metal nanoparticles encapsulated in carbon, carbon fibres. The partly purified nanotubes contain the by-products that could not be eliminated during the purification. The spent catalysts are oxides, mixed oxides, aluminosilicates, zeolites, oxycarbides, mixed oxycarbides, carbonates, metal hydroxides, metal nanoparticles, etc.

Crude and purified nanotubes samples were used to prepare the nanocomposites. Crude MWNTs were produced by catalytic decomposition of acetylene on Co—Fe/Al(OH)₃ catalyst at 700° C. and the crude SWNTs were produced by catalytic decomposition of methane at 950° C. on either Co/MgO catalyst or M/MgO* catalyst (M=Co, Fe, Ni, Mo or their mixtures; M=0.1–50 wt % of the catalyst). The Co/MgO catalyst was prepared by impregnation of commercial MgO by an alcoholic solution of a cobalt salt while the M/MgO* catalyst was prepared as follows: First, 10 g of metallic magnesium are introduced in 200 ml of alcohol (i.e. MeOH, EtOH, . . . ) contained in a 1 liter flask equipped with a reflux condenser and a mechanical stirrer. After about five minutes the alcohol begins to react with magnesium as follows:

$$2\ ROH + Mg \rightarrow Mg(OR)_2 + H_2$$

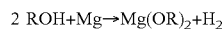

The speed of the reaction is controlled by cooling down the flask if the alcohol is boiling too much. Secondly, the metal salt (e.g. 13.727 g of Fe(NO₃)₃.9H₂O) is dissolved in 50 ml of alcohol by sonication and then added to the magnesium alkoxyde solution under vigorous stirring. The solution gellifies rapidly but the stirring is prolonged to homogenise the gel. Afterwards, 300 ml of water are added to the gel under stirring to form a broken white gel as follows:

$$Mg(OR)_2 + 2\ H_2O \rightarrow Mg(OH)_2 + 2\ ROH$$

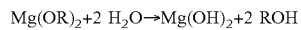

The total amount of alcohol (250 ml) is distilled out by azeotropic distillation, with refilling 50 ml of water every 50 ml of distillate to keep the volume of gel constant. Finally the gel is allowed to stand overnight at room temperature for maturation and it is dried either under supercritical conditions or by lyophilisation, preferably. The dried residue is further dehydrated by heating under an air flow, from room temperature to 370° C. at 3° C./min, kept at 370° C. for 2 hours and cooled down to room temperature at 6° C./min. The latter dehydration proceeds as follows:

$$Mg(OH)_2 \rightarrow MgO + H_2O$$

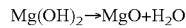

The dehydrated powder collected is called M/MgO* catalyst and it was found to be very active for the production of SWNTs by catalytic decomposition of methane in the presence of hydrogen.

Purified MWNTs were obtained after dissolution of the support in boiling concentrated sodium hydroxide and dissolution of the catalyst in concentrated hydrochloric acid.

Purified SWNTs were obtained after dissolution of the catalyst and support in concentrated hydrochloric acid, followed by filtration and washing until pH=5–7 to obtain a nanotubes/water "wet cake", containing ca. 80–95 wt. % of water, that is dried at 120° C. overnight. In order to decrease the metal content of the purified SWNTs, it was found that oxidation of the crude SWNTs at 250–500° C. in air for a given time (preferably one hour at 300° C.), prior to the dissolution of the catalyst and support, was very effective because the nanotubes are well dispersed on the spent catalyst. For better dispersion of the purified SWNTs in the polymer matrix, it was also found that the lyophilisation of the nanotubes/water "wet cake" was more convenient than its drying at 120° overnight. In fact, the drying at 120° C. provides very hard "rocks" of SWNTs, while the lyophilised SWNTs is a very fine powder.

The catalyst and support content of the nanotubes samples are shown in Table 1.

TABLE 1

Characteristics of the nanotubes samples and their catalyst and support content.

| Sample[a] | Nanotubes | | Catalyst | | Support | |
|---|---|---|---|---|---|---|
| | Length (μm) | Diameter (nm) | Co (wt. %) | Fe (wt. %) | $Al_2O_3$ (wt. %) | MgO (wt. %) |
| Crude MWNTs | ca. 50 | 5–15 | 0.3 | 0.3 | 19 | — |
| Purified MWNTs | ca. 50 | 5–15 | 0.2 | 0.3 | 0.2 | — |
| Crude SWNTs-1 | ca. 10 | 1–2 | 2.5 | — | — | 92.5 |
| Purified SWNTs-1 | ca. 10 | 1–2 | 15 | — | — | 0 |
| Oxidised purified and lyophilised SWNTs-1 | Ca. 10 | 1–2 | 0.3 | — | — | 0 |
| Crude SWNTs-2 | Ca. 10 | 1-2 | 12 | — | — | 79 |
| Purified SWNTs-2 | Ca. 10 | 1–2 | 14 | — | — | 0 |
| Oxidised purified and lyophilised SWNTs-2 | Ca. 10 | 1–2 | 0.5 | — | — | 0 |
| Crude SWNTs-3 | Ca. 10 | 1–2 | — | 12 | — | 79 |
| Purified SWNTs-3 | Ca. 10 | 1–2 | — | 15.5 | — | 0 |
| Oxidised purified and lyophilised SWNTs-3 | Ca. 10 | 1–2 | — | 0.8 | — | 0 |

[a]SWNTs-1 were produced on Co/MgO; SWNTs-2 were produced on Co/MgO*; SWNTs-3 were produced on Fe/MgO*.

I.C.—Layered Silicate Nanoparticles

Silicate nanoparticles are intercalated organic-modified layered silicates from the chemical class of 2:1 phyllosilicate or smectite such as montmorillonite, hectorite, saponite, etc.

Montmorillonite is the most commonly used layered silicate (clay). It is a crystalline 2:1 layered clay mineral with a central alumina octahedral sheet sandwiched between two silica tetrahedral sheets. When these nanoparticles are dispersed in a polymer, they are either intercalated by macromolecules or exfoliated. Therefore, intercalated structures show regularly alternating layered silicates and polymer chains in contrast to exfoliated structures in which the individual clay layers are delaminated and dispersed in the polymer matrix.

The best performances are commonly observed for the exfoliated nanocomposites. The two extreme situations can however coexist in the same material.

The polymer-silicate compatibility is promoted by an ion-exchange reaction of the silicate interlayer sodium cations with alkyl ammonium cations or the like, hereafter called organo-clays (G. Beyer, Polymer News, November 2001).

The investigated organo-clay mineral, Nanofil® 15 was supplied by Sü d-Chemie (Germany). It is a sodium montmorillonite with sodium cations exchanged by distearyldimethylammonium cations. This organo-clay contains about 30 wt. % of the organic cation within its structure and is characterized by an interlayer distance of 2.8 nm.

II. Preparation of the Composite Materials Containing Carbon Nanotubes

The nanocomposites of polymers based on carbon nanotubes and silicate nanoparticles are prepared applying preferably one of the different methods described hereafter. These methods can be divided in two categories that are called "mechanical methods" and "solution methods" depending on the dispersion of the constituents that is achieved mechanically or in solution, respectively.

II. A.—Mechanical Methods

Extrusion Method:

In that method, extruders are used to mix the molten polymer with the carbon nanotubes and organo-clays. The organo-clays are preferably mixed either with the carbon nanotubes or with the polymer before the extrusion.

The polymer, carbon nanotubes and organo-clays can also be mixed together or not before the extrusion.

The form, length and rotation speed of the extruder screws are adjusted to obtain a suitable mixing time. The efficiency of the mixing depends on the screw parameters (design, relation of length to diameter and rotation speed) but also on the extrusion temperature that regulates the viscosity of the polymer. The temperature is either uniform or varies along the screw depending on the desired nanocomposite.

Reactive Extrusion Method:

The extrusion parameters are the same as for the "extrusion method" except that an additional chemical reaction (like cross-linking, etc.) takes place during the extrusion step.

Batch Method:

In that method, the molten polymer is mixed with the carbon nanotubes and organo-clays in a reactor (internal mixer or rolling mill) at a given temperature or for a temperature cycle. The nanocomposite components are introduced either together or one by one. A chemical reaction can also take place between the components.

The samples 1–12b of Table 2 were prepared using the internal mixer type Brabender with a mixing chamber of 72 ml equipped with roller blades. Rotation speeds of 45 or 120 rpm were used (Table 2). The mixing time was 10 minutes and mixing temperatures of 130 or 140° C. were used (Table 2). In the preferred embodiment, the polymer EVA (50 g) is introduced in the mixing chamber preheated at 125° C. and, when the polymer is molten, the filler is added and the mixing is prolonged for 10 minutes. Afterwards, the chamber is opened and the nanocomposite is recovered.

II.B.—Solution Methods

Solution Method a:

In that method, the nanocomposite constituents are dispersed in the solvent at the appropriate temperature by stirring. The dispersion depends on the order of mixing of the various nanocomposite constituents. The stirring is produced mechanically or by sonication. Afterwards, the solvent is eliminated either by filtration or by evaporation at the appropriate temperature. They can also be dispersed in solvents, either individually or not, prior to their mixing.

The preferred solvents are solvents characterized with solubility parameters close to the solubility parameter of the investigated polymer matrix. Mixtures of solvents are also effective.

Surfactants such as the ones known in the field can also be added to the nanocomposite constituents to enhance the dispersion. Non solvents (thus with solubility parameters far from solubility parameter of the investigated polymer matrix) can also be added to the nanocomposite constituents dispersion prior to its filtration.

Solution Method b:

In that method, the carbon nanotubes and the polymer are dispersed in the solvent at the appropriate temperature by stirring like in the "solution method a". Afterwards, the solvent is eliminated either by filtration or by evaporation at the appropriate temperature. The organo-clay and additional nanocomposite constituents are introduced applying one of the "mechanical methods".

Solution Method c:

In that method, the organo-clay and the polymer are dispersed in the solvent at the appropriate temperature by stirring like in the "solution method a". Afterwards, the solvent is eliminated either by filtration or by evaporation at the appropriate temperature. The carbon nanotubes and additional nanocomposite constituents are introduced applying one of the "mechanical methods".

Solution Method d:

In that method the polymer is replaced by its precursors. Then, the nanocomposite constituents are dispersed in the solvent at the appropriate temperature by stirring like in the "solution method a". Afterwards, after reaching good dispersion of the nanocomposite constituents, the polymerisation is performed. The solvent is eliminated either by filtration or by evaporation at the appropriate temperature.

Solution Method e:

In that method, the carbon nanotubes are dispersed in the solvent at the appropriate temperature by stirring like in the "solution method a" but, the polymer is replaced by its precursors. Afterwards, after reaching good dispersion, the polymerisation is performed. The solvent is eliminated either by filtration or by evaporation at the appropriate temperature. The organo-clay and additional nanocomposite constituents are introduced applying one of the "mechanical methods".

Solution Method f:

In that method, the organo-clay is dispersed in the solvent at the appropriate temperature by stirring like in the "solution method a" but, the polymer is replaced by its precursors. Afterwards, after reaching good dispersion, the polymerisation is performed. The solvent is eliminated either by filtration or by evaporation at the appropriate temperature. The carbon nanotubes and additional nanocomposite constituents are introduced applying one of the "mechanical methods".

III. Measure of the Properties of the Composite Materials

III.A—Transmission Electron Microscope (TEM) Analysis

The dispersion of the nanotubes in the polymer matrix was studied by transmission electron microscopy (TEM) with Philips Tecnaï T10. For analysis, the composite samples were cut into very thin slices (about 80 nm) by an ultra-microtome. Then, the slices were deposited onto a conventional TEM grid.

All the samples present a relatively homogeneous dispersion of the nanotubes in the polymer matrix (Tables 2 and 3; Decreasing dispersion order: +++>++>+>−>−−>−−−). Nevertheless, applying MWNTs, the addition of organo-clay, as well as the use of crude nanotubes and the increase of the wt. % of the nanotubes lead to a more homogeneous dispersion. Applying SWNTs, the best dispersion was obtained using the "oxidised purified and lyophilised" samples (Table 3). The addition of organo-clay was also helpful to the dispersion of the SWNTs in the polymer matrix.

III.B.—TGA Analysis

TGA analysis in air at 20 K/min were carried out on the polymer EVA (Escorene UL 00328) and on EVA-based nanocomposites. The results are summarised in Table 2.

As can be seen in Table 2, the $T_{max}$ is higher for the EVA based nanocomposites than for the polymer EVA; $T_{max}$ is the maximal temperature of the second and therefore main degradation peak of the EVA degradations—under oxidative conditions according to G. Beyer, Polymer News, November 2001.

From the TGA results in Table 2 concerning the nanocomposites containing 2.4 wt. % of either purified MWNTs (sample 1) or organo-clay (sample 5), the thermal stabilisation effect in air of the polymer fillers is as follows: organo-clay>purified MWNTs.

From the TGA results in Table 2 concerning the nanocomposites containing 4.8 wt. % of either purified MWNTs (sample 2), crude MWNTs (sample 8a), or organo-clay (sample 6), the thermal stabilisation effect in air of the polymer fillers is as follows: crude MWNTs>organo-clay>purified MWNTs.

The increase of the organo-clay content from 2.4 to 4.8 wt. % causes decrease of the $T_{max}$ (Table 2).

As distinct from the effect of increasing the organo-clay content, increasing the content of purified MWNTs causes a small increase of the $T_{max}$ (Table 2).

Nevertheless, the maximal thermal stabilisation effect in air was observed when using 5 wt. % of crude MWNTs (sample 8a). Surprisingly, crude MWNTs are much more efficient fillers for thermal stabilisation of polymers than purified MWNTs. This improvement may be caused by the concomitant presence of MWNTs, catalyst support and catalyst.

From the TGA analysis of the nanocomposite containing 2.4 wt. % of purified MWNTs and 2.4 wt. % of organo-clay (sample 7; Table 2), it is evident from the $T_{max}$ that there is no synergistic improvement effect in thermal stabilisation caused by the concomitant use of both purified MWNTs and organo-clay as polymer fillers.

III.C.—Cone Calorimeter Analysis

It is reported (G. Beyer, Polymer—News, November 2001) that from an engineering point of view, it is important to know what hazards within a fire must be prevented and only then strategies for measurements and improvements can be developed.

Extensive research at NIST (National Institute for Standards and Technology, USA) led to the important conclusion which allows significant simplification of the problem for hazards in fires: The heat release rate, in particular the peak heat release rate, is the single most important parameter in a fire and can be viewed as the "driving force" of the fire.

Therefore, today the universal choice of an engineering test for flame retardant polymers is the cone calorimeter. The measuring principle is the oxygen depletion with a relationship between the mass of oxygen consumed from the air and the amount of heat released.

The cone calorimeter is standardized as ASTM E 1354 and ISO 5660.

Cone calorimeter analysis using 35 kW/m² were carried out on the polymer EVA (Escorene UL 00328), on polymer PE (BP8063), on EVA based nanocomposites and on PE based nanocomposites. The results are summarised in Tables 2 and 3. In these tables, the following important parameters were used to characterise the flame retardant effect of the different polymer fillers. These parameters are:

PHRR (Peak of Heat Release Rate), which represents the maximum heat release rate during combustion.

Cracks density, estimated from the residues of the cone calorimeter analysis (decreasing cracks density order: +++>++>+>−>−−>−−−).

Surface quality, estimated from the residues of the cone calorimeter analysis (decreasing surface quality order: +++>++>+>−>−−>−−−).

III.C.a.—PHRR Results

From the PHRR point of view, it is evident from the results in Table 2 that all of the filled polymers used have improved flame retardant effects.

For EVA and EVA based nanocomposites containing 2.4 wt. % of filler, the PHRR decreases as follows: EVA>organo-clay~purified nanotubes. Surprisingly the purified nanotubes are as effective in the reduction of PHRR as the nanocomposites bases on organo-clay.

For EVA and EVA based nanocomposites containing 4.8 wt. % of filler, the PHRR decreases as follows: EVA>organo-clay>purified nanotubes=crude nanotubes.

Surprisingly the crude nanotubes are as effective in the reduction of PHRR as the purified nanotubes.

Increasing the filler content from 2.4 to 4.8 wt. % causes an additional flame retardant effect if the filler is organo-clay and it becomes very important when purified or crude MWNTs are used.

A surprising synergism flame retardant effect between MWNTs and organo-clay was observed for the nanocomposite containing 2.4 wt. % of purified MWNTs and 2.4 wt. % of organo-clay (sample 7). The latter sample was found to be the best flame retardant nanocomposite.

From the PHRR point of view, the variation of the screw velocity from 45 rpm (sample 8a) to 120 rpm (sample 8b) caused no flame retardant changes on the nanocomposites containing 4.8 wt. % of crude MWNTs.

For PE and PE based nanocomposites containing 4.8 wt. % of filler (Table 3), the PHRR decreases as follows: purified SWNTs>crude SWNTs>PE>purified MWNTs>crude MWNTs. The same order was found for the nanocomposites containing 9.1 wt. % of filler.

From the PHRR and time to ignition results (Table 3), MWNTs work as flame retardant in PE with no reduction of time to ignition while SWNTs do not work as flame retardant in PE.

III.C.b.—Cracks Density Results and Surface Quality Results

For the flame retardant EVA based nanocomposites containing 2.4 wt. % of filler (Table 2), the cracks density increases in the order: purified MWNTs<organo-clay. Again, a very important synergistic effect reducing the cracks density to zero, was surprisingly observed when the nanocomposite contains 2.4 wt. % of purified MWNTs and 2.4 wt. % of organo-clay (FIG. 1c).

The surprising synergistic effect for improved flame retardancy by the filler combination nanotube and organo-clay can be explained by the improved closed surface. This improved char acts as an insulating and non-burning material that reduces the emission of volatile products (fuel) into the flame area. The less cracks are present, the better is the reduction of emission and the reduction of PHRR. The fillers play an active role in the formation of this char but obviously also strengthen it and make it more resistant to mechanically cracking.

For the flame retardant EVA based nanocomposites containing 4.8 wt. % of filler (Table 2; FIGS. 1a–b), the cracks density increases in the order: crude MWNTs<purified MWNTs<organo-clay.

Increasing the filler content of the EVA based nanocomposites from 2.4 to 4.8 wt. % (Table 2), causes crack density decreases using purified MWNTs or organo-clay.

An analogous flame retardant behaviour is observed with crude or purified SWNTs of different types specified in Table 1. Among the nanocomposites including crude or purified SWNTs, better behaviours are observed with SWNTs-2 and -3. The better behaviours of the SWNTs-2 and -3 may be due to the higher nanotubes content of the samples. Even better behaviours were observed for the "oxidised purified and lyophilised" SWNTs-1, -2 and -3 samples. The latter improvement may be due to the good dispersion of the SWNTs in the nanocomposites.

III.D.—Electrical Conductivity Measurements

Description of the Experiments:

Resistivity was measured using a 4-wire method. The samples are cut into pieces with dimensions 60 mm×20 mm×2.8 mm.

The contacts are made by copper wire (2 mm diameter) and silver paste. The V and I electrodes are fixed along the plate as: I-V-V-I. The distances between the V-V and V-I electrodes are 35 mm and 12 mm, respectively. A 4-wire microohmmeter (Burnster, Model P 133/0020) was used to measure the resistance between the V electrodes. Resistivity was calculated using Pouillet's law.

Results:

The resistivity decreases with increasing concentration of nanotubes in the composite material. With 2.4 wt. % pure MWNTs, the resistivity is higher than $2 \cdot 10^3$ $\Omega$.cm, but decreases to less than 10 $\Omega$.cm with 4.8 wt. % pure MWNTs.

Surprisingly, adding 2.4 wt. % of organo-clay to the composite with 2.4 wt. % MWNTs decreases the resistivity from more than $2 \cdot 10^3$ $\Omega$.cm to about $8 \cdot 10^1$ $\Omega$.cm. The latter resistivity decrease is achieved due to the homogeneous dispersion of the nanotubes in the polymer matrice achieved by the synergetic effect of both organo-clays and carbon nanotubes.

Depending on the concentrations and on the mixing procedure, resistivity values between 8 $\Omega$.cm and $8 \cdot 10^{12}$ $\Omega$.cm have been found.

More generally, it has been shown that the nanocomposites according to the present invention possess an electrical resistivity between $10^{-4}$ $\Omega$.cm and $8 \cdot 10^{12}$ $\Omega$.cm, and preferably between 1 $\Omega$.cm and $10^3$ $\Omega$.cm.

CONCLUSION

As a conclusion, in the nanocomposites as disclosed in the present invention the components are well dispersed. It has been shown that by adding additives components such as layered silicates nanoparticles, it is possible to improve the physical properties of the nanocomposites finally obtained, probably due said homogeneous dispersed structure. Therefore, these nanocomposites provide an industrial breakthrough by allowing for homogeneous dispersion and increased properties transfer from the carbon nanotubes to the composite materials. Said homogeneous dispersion of the nanotubes in the nanocomposites and the resulting improved properties transfer to the composites materials are achieved by the synergetic effect of both organo-clays and carbon nanotubes.

Moreover, the nanocomposites according to the present invention have the advantage of being able to be produced according to a quite wide range of methods, giving optimal production flexibility.

Different applications of said nanocomposites could be envisaged taking benefit from their properties. For example, they could be used as flame retardant, as anti-static material in conductive wires, as wire protector sheath, as anti-cracks in surface protection coatings, as anti-cracks in reinforced materials, as surface protection coatings, as reinforced materials and as or in light-emitting devices.

providing the polymers, the carbon nanotubes, the layered silicate nanoparticles, and if necessary the microfiller, and mixing said different components in adequate conditions so as to obtain a homogenous dispersion, wherein the step of providing the carbon nanotubes comprises the step of producing said carbon nanotubes on a M/MgO catalyst, wherein M is selected from the group consisting of Co, Fe, Ni, Mo or their mixtures, and M represents 0.1–50 wt % of the catalyst, the MgO being prepared in situ from metallic magnesium.

TABLE 2

Nanotubes dispersion from TEM observations, flame retardant results from TGA and cone calorimeter analysis, and resistivity results of EVA-based nanocomposites.

| Sample | EVA (wt. %) | MWNTs (wt. %) Purif. | MWNTs (wt. %) Crude | SWNTs-1 (wt. %) Purif. | SWNTs-1 (wt. %) Crude | Organo-clay (wt. %) | Nanotubes dispersion (TEM) | TGA Analysis $T_{max}$ (° C.) | Cone calorimeter analysis PHRR (kW/m$^2$) | Cracks density | Surface quality | Resistivity ($\Omega \cdot$ cm) |
|---|---|---|---|---|---|---|---|---|---|---|---|---|
| Escorene | 100 | — | — | — | — | — | — | 477 | 580 | | | * |
| 1$^a$ | 97.6 | 2.4 | — | — | — | — | + | 501 | 530 | + | + | * |
| 2$^a$ | 95.2 | 4.8 | — | — | — | — | ++ | 503 | 400 | − | + | 8.33 |
| 3$^a$ | 95.2 | — | 2.4 | — | — | 2.4 | + | | | | | |
| 4$^a$ | 95.2 | — | — | — | 2.4 | 2.4 | + | | | | | |
| 5$^a$ | 97.6 | — | — | — | — | 2.4 | | 511 | 530 | +++ | −− | * |
| 6$^a$ | 95.2 | — | — | — | — | 4.8 | | 505 | 470 | ++ | − | * |
| 7$^{a,b}$ | 95.2 | 2.4 | — | — | — | 2.4 | +++ | 503 | 370 | −−− | +++ | 83.98 |
| 8a$^a$ | 95.2 | — | 4.8 | — | — | — | +++ | 513 | 400 | −− | ++ | 18.24 |
| 8b$^c$ | 95.2 | — | 4.8 | — | — | — | +++ | | 400 | −− | ++ | 128.01 |
| 9$^a$ | 97.6 | — | — | 2.4 | — | — | −− | | 470 | + | + | * |
| 10$^a$ | 95.2 | — | — | 4.8 | — | — | − | | 420 | − | + | |
| 11$^{a,b}$ | 95.2 | — | — | 2.4 | — | 2.4 | + | | 380 | −−− | +++ | |
| 12a$^a$ | 95.2 | — | — | — | 4.8 | — | + | | | | | |
| 12b$^c$ | 95.2 | — | — | — | 4.8 | — | ++ | | | | | |

$^a$The screw velocity was 45 rpm and the mixing temperature was 130° C.
$^b$The nanotubes and nanofiller were premixed before their addition.
$^c$The screw velocity was 120 rpm and the mixing temperature was 140° C.
* The resistivity is too high to be measured.

TABLE 3

Nanotubes dispersion from TEM and Tork observations and flame retardant results from cone calorimeter analysis of PE-based nanocomposites.

| Sample | PE$^c$ (wt. %) | MWNTs (wt. %) Purif. | MWNTs (wt. %) Crude | SWNTs-1 (wt. %) Purif. | SWNTs-1 (wt. %) Crude | Tork$^d$ (a.u.) | Nanotubes dispersion (TEM) | Time to ignition (s) | Cone calorimeter analysis PHRR (kW/m$^2$) | Cracks density | Surface Quality |
|---|---|---|---|---|---|---|---|---|---|---|---|
| PE | 100 | — | — | — | — | | | 90 | 454 | | |
| 13$^a$ | 95.2 | 4.8 | — | — | — | 400 | +++ | 100 | 289 | −− | + |
| 14$^a$ | 90.9 | 9.1 | — | — | — | 820 | +++ | 114 | 359 | −− | + |
| 15$^a$ | 95.2 | — | 4.8 | — | — | 320 | +++ | 91 | 326 | −− | + |
| 16$^a$ | 90.9 | — | 9.1 | — | — | 620 | +++ | 100 | 374 | −− | + |
| 17$^{a,b}$ | 95.2 | — | — | 4.8 | — | 180 | ++ | 68 | 673 | ++ | − |
| 18$^{a,b}$ | 90.9 | — | — | 9.1 | — | 340 | ++ | 63 | 615 | ++ | − |
| 19$^a$ | 95.2 | — | — | — | 4.8 | 160 | ++ | 103 | 634 | ++ | − |
| 20$^a$ | 90.9 | — | — | — | 9.1 | 240 | ++ | 104 | 476 | ++ | − |

$^a$The screw velocity was 45 rpm, the mixing time was 10 min and the mixing temperature was 180° C.
$^b$The SWNTs were oxidised, purified and lyophilised.
$^c$PE stands for polyethylene BP8063.
$^d$Tork is the relative force needed to mix the nanocomposite. It gives an indication of the relative viscosities of the nanocomposites at the end of the 10 min mixing.

The invention claimed is:

1. A process for obtaining the nanocomposite comprising as components polymers, carbon nanotubes and layered silicate nanoparticles, said process comprising 2. The process according to claim 1, wherein the step of providing the carbon nanotubes further comprises the step of purifying the crude carbon nanotubes by oxidation of the crude nanotubes at 250–500° C. in pure or diluted oxygen for a given time, prior to the dissolution of a spent catalyst, while the nanotubes are well dispersed on it.

3. The process according to claim 2, wherein the step of providing the carbon nanotubes further comprises the step of drying the carbon nanotubes produced to obtain a very fine powder, by lyophilisation of a nanotubes/water "wet cake".

4. The process according to claim 2, wherein the step of providing the carbon nanotubes further comprises the step of drying the carbon nanotubes produced to obtain a very fine powder, by azeotrope distillation of a nanotubes/water "wet cake" and wherein benzene, toluene or xylene is used to make the azeotrope.

5. The process according to claim 3, wherein said nanotubes/water "wet cake" contains 80–95 wt % of water.

6. The process according to claim 4, wherein said nanotubes/water "wet cake" contains 80–95 wt % of water.

* * * * *